United States Patent
Sherlock et al.

(10) Patent No.: US 8,971,594 B2
(45) Date of Patent: *Mar. 3, 2015

(54) THINNED FINGER SENSOR AND ASSOCIATED METHODS

(71) Applicant: Authentec, Inc., Melbourne, FL (US)

(72) Inventors: Peter E. Sherlock, Viera, FL (US); Philip J. Spletter, Satellite Beach, FL (US)

(73) Assignee: Authentec, Inc., Melbourne, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/737,989

(22) Filed: Jan. 10, 2013

(65) Prior Publication Data
US 2013/0119488 A1 May 16, 2013

Related U.S. Application Data

(63) Continuation of application No. 12/424,157, filed on Apr. 15, 2009, now Pat. No. 8,358,816, which is a continuation-in-part of application No. 11/550,669, filed on Oct. 18, 2006, now Pat. No. 7,894,643.

(60) Provisional application No. 60/727,739, filed on Oct. 18, 2005.

(51) Int. Cl.
G06K 9/00 (2006.01)
H01L 29/84 (2006.01)
(Continued)

(52) U.S. Cl.
CPC ............ H01L 29/84 (2013.01); G06K 9/00013 (2013.01); G06K 9/00053 (2013.01); G06K 9/00006 (2013.01); H05K 1/028 (2013.01); H05K 5/0247 (2013.01)
USPC ........................................ 382/124

(58) Field of Classification Search
None
See application file for complete search history.

(56) References Cited

U.S. PATENT DOCUMENTS 4,353,056 A 10/1982 Tsikos
5,159,159 A 10/1992 Asher
(Continued)

FOREIGN PATENT DOCUMENTS

DE 19921231 11/2000
EP 0941696 9/1999
(Continued)

OTHER PUBLICATIONS

Schippers et al. "Thermal Flexible Foil-Fingerprint Sensor." 13th International Conference on Solid-State Sensors, Actuators and Microsystems, vol. 1, Jun. 5, 2005, pp. 579-580.*
(Continued)

Primary Examiner — Jon Chang
(74) Attorney, Agent, or Firm — Allen, Dyer, Doppelt, Milbrath & Gilchrist, P.A.

(57) ABSTRACT

An electronic device may include a housing with a connector member opening therein, electronic circuitry within the housing, and a finger sensor assembly carried by the housing. The finger assembly may include a thinned finger sensing integrated circuit (IC) secured to the housing that has a thickness less than 200 microns. The finger sensor assembly may also include a connector member extending through the connector member opening in the housing and coupling together the thinned finger sensing IC and the electronic circuitry. The thinned finger sensing IC may be adhesively secured to the housing, such as using a pressure sensitive adhesive, and the thinned finger sensing IC may conform to a non-planar surface.

29 Claims, 8 Drawing Sheets

(51) Int. Cl.
*H05K 1/02* (2006.01)
*H05K 5/02* (2006.01)

(56) References Cited

U.S. PATENT DOCUMENTS

| | | | |
|---|---|---|---|
| 5,400,662 A | 3/1995 | Tamori | |
| 5,887,343 A | 3/1999 | Salatino et al. | |
| 5,956,415 A | 9/1999 | McCalley et al. | |
| 5,963,679 A | 10/1999 | Setlak | |
| 6,011,859 A | 1/2000 | Kalnitsky et al. | |
| 6,064,753 A | 5/2000 | Bolle et al. | |
| 6,234,031 B1 | 5/2001 | Suga | |
| 6,259,804 B1 | 7/2001 | Setlak et al. | |
| 6,333,989 B1 | 12/2001 | Borza | |
| 6,347,040 B1 | 2/2002 | Fries et al. | |
| 6,392,143 B1 | 5/2002 | Koshio | |
| 6,528,723 B2 | 3/2003 | Fries et al. | |
| 6,628,812 B1 | 9/2003 | Setlak et al. | |
| 6,646,316 B2 | 11/2003 | Wu et al. | |
| 6,713,677 B2 | 3/2004 | Fischbach et al. | |
| 6,737,329 B2 | 5/2004 | Lepert et al. | |
| 6,825,551 B1 | 11/2004 | Do Bento Vieira | |
| 6,838,362 B2 | 1/2005 | Mastromatteo et al. | |
| 6,906,407 B2 | 6/2005 | Byers et al. | |
| 6,912,299 B1 | 6/2005 | Hoshino | |
| 6,924,496 B2 | 8/2005 | Manansala | |
| 6,950,541 B1 | 9/2005 | Setlak et al. | |
| 7,015,579 B2 | 3/2006 | Okada et al. | |
| 7,049,166 B2 | 5/2006 | Salatino et al. | |
| 7,076,089 B2 | 7/2006 | Brandt et al. | |
| 7,084,474 B2 | 8/2006 | Hung et al. | |
| 7,090,139 B2 | 8/2006 | Kasuga et al. | |
| 7,099,496 B2 | 8/2006 | Benkley, III | |
| 7,300,816 B2 | 11/2007 | Manansala | |
| 7,315,070 B2 | 1/2008 | Okada et al. | |
| 7,327,041 B2 | 2/2008 | Dotta et al. | |
| 7,393,711 B2 | 7/2008 | Bolis et al. | |
| 7,424,136 B2 | 9/2008 | Setlak et al. | |
| 7,715,593 B1 | 5/2010 | Adams et al. | |
| 7,751,601 B2 | 7/2010 | Benkley, III | |
| 2001/0012201 A1* | 8/2001 | Fries et al. | 361/807 |
| 2001/0026636 A1 | 10/2001 | Mainguet | |
| 2002/0048312 A1* | 4/2002 | Schurr et al. | 374/208 |
| 2002/0126882 A1 | 9/2002 | Funahashi | |
| 2003/0048256 A1 | 3/2003 | Salmon | |
| 2003/0048597 A1 | 3/2003 | Wang et al. | |
| 2003/0063445 A1* | 4/2003 | Fischbach et al. | 361/752 |
| 2003/0104647 A1 | 6/2003 | Siegel et al. | |
| 2003/0178714 A1 | 9/2003 | Sakoda et al. | |
| 2003/0215117 A1 | 11/2003 | Hata | |
| 2003/0215976 A1 | 11/2003 | Chou et al. | |
| 2003/0229811 A1* | 12/2003 | Siegel et al. | 713/202 |
| 2005/0031174 A1 | 2/2005 | Ryhanen et al. | |
| 2005/0069180 A1 | 3/2005 | Setlak et al. | |
| 2005/0073507 A1 | 4/2005 | Richter et al. | |
| 2005/0089202 A1 | 4/2005 | Setlak et al. | |
| 2005/0139685 A1 | 6/2005 | Kozlay | |
| 2005/0146054 A1 | 7/2005 | Chu et al. | |
| 2005/0231216 A1 | 10/2005 | Gozzini | |
| 2005/0240778 A1 | 10/2005 | Saito et al. | |
| 2005/0263836 A1 | 12/2005 | Okada et al. | |
| 2006/0009251 A1 | 1/2006 | Noda et al. | |
| 2006/0034499 A1* | 2/2006 | Shinoda et al. | 382/124 |
| 2006/0050935 A1 | 3/2006 | Bustgens et al. | |
| 2006/0083411 A1 | 4/2006 | Benkley, III | |
| 2007/0086634 A1 | 4/2007 | Setlak et al. | |
| 2008/0085038 A1 | 4/2008 | Huang et al. | |
| 2008/0267462 A1 | 10/2008 | Nelson et al. | |
| 2009/0058733 A1 | 3/2009 | Kurashima et al. | |
| 2010/0039121 A1* | 2/2010 | Iliev et al. | 324/658 |

FOREIGN PATENT DOCUMENTS

| | | |
|---|---|---|
| EP | 1316913 | 6/2003 |
| JP | 2004006889 | 1/2004 |
| JP | 2005346238 | 12/2005 |
| WO | 9830967 | 7/1998 |
| WO | 9960513 | 11/1999 |
| WO | 0068874 | 11/2000 |
| WO | 0171648 | 9/2001 |
| WO | 0175962 | 10/2001 |
| WO | 0247018 | 6/2002 |
| WO | 2004066194 | 8/2004 |
| WO | 2006041780 | 4/2006 |
| WO | 2007047748 | 4/2007 |

OTHER PUBLICATIONS

Riley et al., "Tutorial 1, Introduction to Flip Chip: What, Why, How", FlipChips Dot Com Tutorials, Oct. 2000, pp. 1-6.
Opdahl, "Tutorial 5, Anisotropic Conductive Film (ACF) Flip Chip", FlipChips Dot Com Tutorials, Feb. 2001, pp. 1-6.
Gilleo, "Tutorial 15, Substrates for Flip Chip", FlipChips Dot Com Tutorials, Jan. 2002, pp. 1-4.
JP2005528680(T), Sep. 22, 2005, Espacenet—Bibliographic Data with abstract of corresponding document, 1 pg.
JP2003529933(T), Oct. 7, 2003, Espacenet—Bibliographic Data with abstract of corresponding document, 1 pg.
JP2002516439(T), Jun. 4, 2002, Espacenet—Bibliographic Data with abstract of corresponding document, 1 pg.
"Validity VFS101: reliable 2D Swipe Sensor™ Fingerprint Imaging on Flexible Tape", Product Brochure, Validity, Inc. Jul. 2004, 4 pages, available at http://web.archive.org/web/20040704002508/validityinc.com/ ValidityProductBrochure0404.pdf.
"Validity Sensors, Identify with Validity", Validity, Inc. Oct. 9, 2004, 7 pages, available at http://web.archive.org/web/20041009161351/www.validityinc.com/index.htm.
Ratha et al., "Automatic Fingerprint Recognition Systems, Passage"; Automatic Fingerprint Recognition Systems, New York, Springer Verlag, US, 2003, pp. 37-44; XP002414501.
Japanese Patent Abstract 2005115836A, Alps Electric Co. Ltd, Apr. 28, 2005, 1 pg.
Japanese Patent Abstract 2003271937, Matsushita Electric Ind. Co. Ltd, Sep. 26, 2003, 1 pg.

* cited by examiner

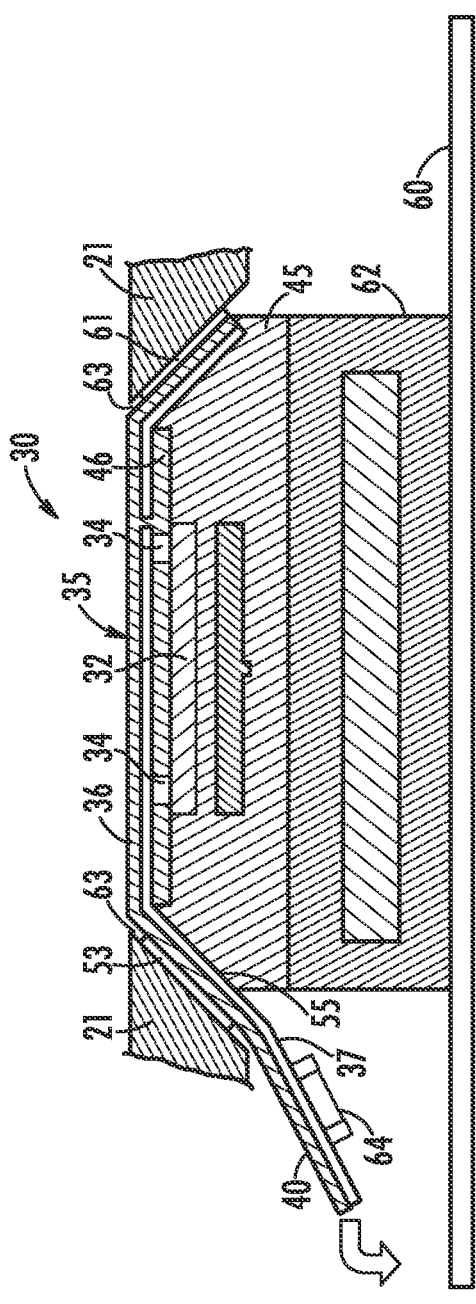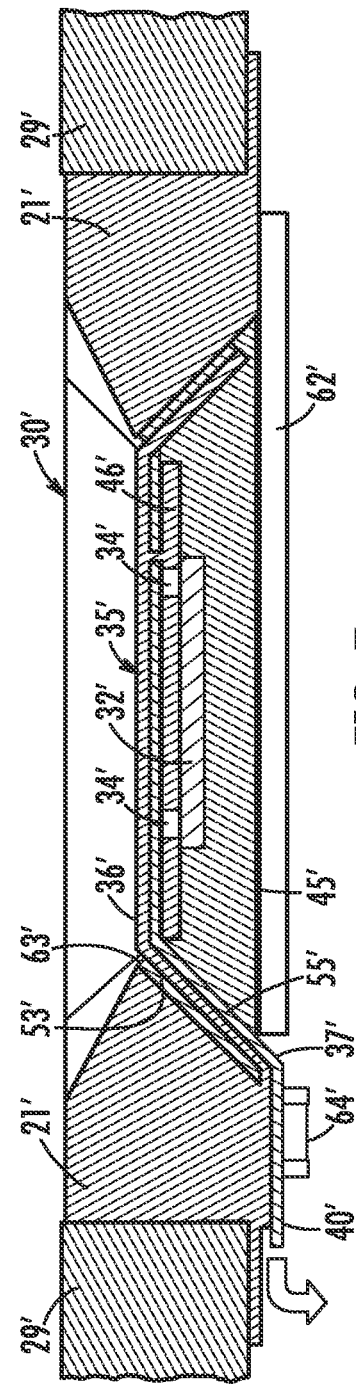

US 8,971,594 B2

THINNED FINGER SENSOR AND ASSOCIATED METHODS

FIELD OF THE INVENTION

The present invention relates to the field of electronics, and, more particularly, to the field of finger sensors including finger sensing integrated circuits, and associated manufacturing methods.

BACKGROUND OF THE INVENTION

Sensors including integrated circuits (ICs) that directly sense the physical properties of objects in the sensor's environment have come into widespread use in electronic equipment. These ICs are desirably in close proximity to the external environments they measure, but they should not be damaged by the mechanical and/or electrical events that an external environment can apply.

One type of such sensing is finger sensing and associated matching that have become a reliable and widely used technique for personal identification or verification. In particular, a common approach to fingerprint identification involves scanning a sample fingerprint or an image thereof and storing the image and/or unique characteristics of the fingerprint image. The characteristics of a sample fingerprint may be compared to information for reference fingerprints already in a database to determine proper identification of a person, such as for verification purposes.

A particularly advantageous approach to fingerprint sensing is disclosed in U.S. Pat. Nos. 5,963,679 and 6,259,804, assigned to the assignee of the present invention, the entire contents of which are incorporated herein by reference. The fingerprint sensor is an integrated circuit sensor that drives the user's finger with an electric field signal and senses the electric field with an array of electric field sensing pixels on the integrated circuit substrate. Additional finger sensing integrated circuits and methods are disclosed in U.S. Published Patent Application No. 2005/0089202 entitled "Multi-biometric finger sensor including electric field sensing pixels and associated methods", also assigned to the assignee of the present invention, and the entire contents of which are incorporated herein by reference.

A number of prior art references disclose various types of packaging of IC sensors. For example, U.S. Pat. No. 6,646,316 to Wu et al. discloses an optical sensor including a sensing die with bond pads on an upper surface thereof. A flexible circuit board is coupled to the bond pads, and has an opening over the sensing surface. A transparent glass layer covers the opening in the flexible circuit board. U.S. Pat. No. 6,924,496 to Manansala discloses a similar flexible circuit attachment to a fingerprint sensor, but leaves the area above the surface open.

U.S. Pat. No. 7,090,139 to Kasuga et al. discloses a smart card including a fingerprint sensor having bond pads attached to wiring film, and also including a window or opening above the sensing surface. U.S. Published Patent Application No. 2005/0139685 to Kozlay discloses a similar arrangement for a fingerprint sensor.

Some fingerprint sensors are based on thin film technology, such as disclosed in U.S. Published Application No. 2006/0050935 A1 to Bustgens et al. Other fingerprint sensors may include sensing elements on a flexible substrate, such as disclosed in U.S. Pat. No. 7,099,496 to Benkley, III. These sensors may be slightly more rugged than integrated circuit based sensors, but may have performance shortcomings.

U.S. Published Patent Application No. 2005/0031174 A1 to Ryhanen et al. discloses a flexible circuit board covering an ASIC for capacitive electrode fingerprint sensing, and wherein the sensing electrodes are on the surface of the flexible substrate and covered with a thin protective polymer layer. In some embodiments, the sensor may wrap the flexible circuit around to the back side of the ASIC for attachment to a circuit board in a ball grid form.

U.S. Pat. No. 5,887,343, assigned to the assignee of the present invention, discloses an embodiment of a fingerprint sensor package that includes a transparent layer over the finger sensing area of a finger sensing IC. A chip carrier, having an opening for the sensing area, is coupled, either capacitively or electrically, to the bond pads on the IC via peripheral regions of the transparent layer.

U.S. Pat. No. 6,392,143 to Koshio discloses a flexible finger sensing IC mounted onto a flexible substrate. The finger sensing IC has aluminum wires coupled to external package wiring. The finger sensing IC may be mounted onto an external curved surface such as a pipe, ballpoint pen, etc.

U.S. Published Patent Application No. 2005/0263836 to Okada et al. discloses a finger sensing package having an LSI chip for reading a fingerprint, a substrate having external connection terminals and to which the LSI chip is fixed, and a chip fixing mechanism for fixing the LSI chip in a state where the LSI chip is deformed so as to form a curved surface. The finger sensing area is flexible, such as to be formed into a curved shape, but the package is mounted on a flat surface.

U.S. Published Patent Application No. 2003/0215117 to Hata discloses a fingerprint sensing apparatus with a flexible finger sensing IC mounted on a substrate. The fingerprint sensing IC is connected to adjacent electronics, such as LED chips, which are also mounted externally on the substrate. This finger sensing apparatus is mounted on a wiring substrate.

Finger sensing ICs are currently used in portable electronic devices. Although the finger sensing IC may be exposed to the external environment, the finger sensing IC is typically installed and coupled to an underlying internal printed circuit board (PCB) of the electronic device. Accordingly, manufacturers of the electronic device typically allocate limited space on the internal PCB to mount the finger sensing IC. The housing of the portable electronic device typically would also include an opening large enough to provide user access to the finger sensing surface of the finger sensing IC. In other words, a typical portable electronic device may sacrifice limited real estate on the internal PCB.

SUMMARY OF THE INVENTION

In view of the foregoing background, it is therefore an object of the present invention to provide a finger sensor assembly that may be easily installed onto an electronic device and may more efficiently use limited space, and related methods.

These and other objects, features, and advantages in accordance with the present invention are provided by an electronic device that includes a finger sensor mountable on a surface of the device housing. More particularly, the electronic device may comprise a housing having a connector member opening therein, electronic circuitry contained within the housing, and the finger sensor assembly being carried by the housing. The finger sensor assembly may comprise a thinned finger sensing integrated circuit (IC) carried by the housing, and a connector member extending through the connector member opening in the housing and coupling together the thinned finger sensing IC and the electronic circuitry. The thinned finger sensing IC may include a thinned monocrystalline substrate, such as less than 200 microns in thickness. In addition, the housing may have a non-planar surface, and the thinned finger sensing IC may be secured to the non-planar surface and conforms in shape thereto. Advantageously, the finger sensor assembly may be also readily installed onto the housing and coupled to the electronic circuitry of the electronic device above the circuitry without sacrificing the limited area on the PCB, for example. A considerably smaller housing opening may also be used.

The finger sensor assembly may further comprise an adhesive layer adhesively securing the thinned finger sensing IC to the housing. The adhesive layer may comprise a pressure sensitive adhesive, for example. The thinned finger sensing IC may have a thickness less than 200 microns, and more preferably, less than 50 microns, for example.

The thinned finger sensing IC may comprise a finger sensing area and a plurality of bond pads adjacent thereto. Additionally, the connector member may comprise a flexible circuit including a flexible layer, and a plurality of conductive traces carried by the flexible layer and coupled to respective ones of the bond pads. The flexible layer may cover both the finger sensing area and the bond pads. The flexible circuit may comprise a connector portion extending outwardly beyond the finger sensing area and the bond pads. The electronic circuitry may also comprise a printed circuit board and a finger sensor connector carried thereby, with the finger sensor connector receiving the connector portion of the flexible circuit. At least one of a drive electrode and an electrostatic discharge (ESD) electrode may be carried by the flexible layer.

A method aspect is directed to making an electronic device. The method may comprise providing a housing having at least one connector member opening therein and electronic circuitry contained therein, and securing a finger sensor assembly onto the housing. The finger sensor assembly may comprise a thinned finger sensing integrated circuit (IC) having a thickness less than 200 microns. The finger sensor assembly may also include at least one connector member extending through the at least one connector member opening in the housing and coupling together the thinned finger sensing IC and the electronic circuitry.

BRIEF DESCRIPTION OF THE DRAWINGS

FIG. 6 is a schematic cross-sectional view of a mounted finger sensor in accordance with the invention.

FIG. 7 is a schematic cross-sectional view of another embodiment of a mounted finger sensor in accordance with the invention.

DETAILED DESCRIPTION OF THE PREFERRED EMBODIMENTS

Figure 1:
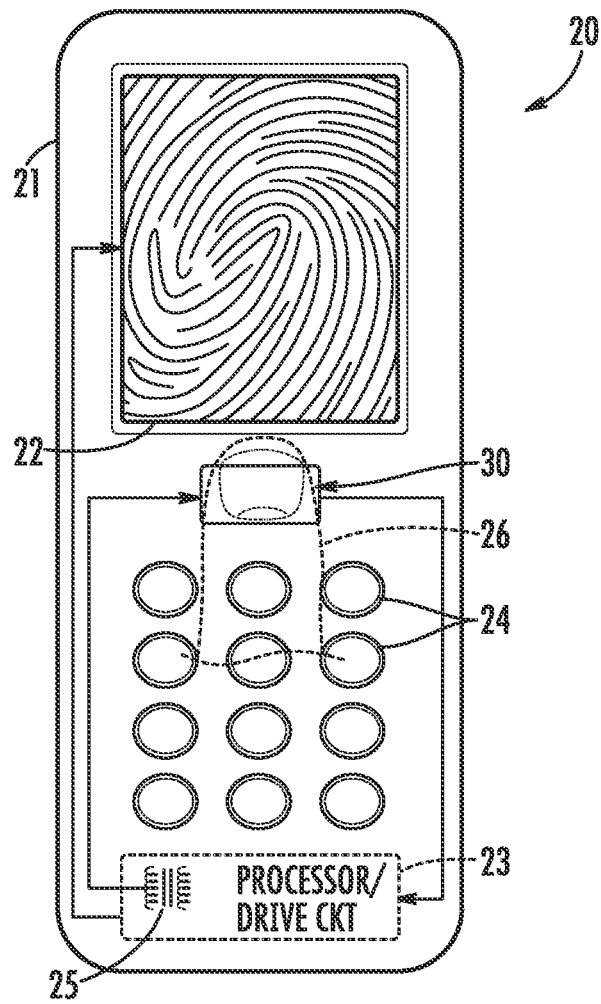
FIG. 1 is a schematic plan view of a cellular telephone including a finger sensor in accordance with the invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout and prime notation is used to indicate similar elements in alternative embodiments.

Referring initially to FIGS. 1-4, embodiments of a finger sensor 30 in accordance with the invention are now described. The finger sensor 30 is illustratively mounted on an exposed surface of a candy bar-type cellular telephone 20. The illustrated candy bar-type cellular telephone 20 is relatively compact and does not include a flip cover or other arrangement to protect the finger sensor 30 as may be done in other types of cellular phones. Of course, the finger sensor 30 can also be used with these other more protective types of cell phones as will be appreciated by those skilled in the art. The finger sensor 30 can also be used with other portable and stationary electronic devices as well. The increased durability and ruggedness of the finger sensor 30 will permit its widespread use even when exposed.

The cellular phone 20 includes a housing 21, a display 22 carried by the housing, and processor/drive circuitry 23 also carried by the housing and connected to the display and to the finger sensor 30. An array of input keys 24 are also provided and used for conventional cellphone dialing and other applications as will be appreciated by those skilled in the art. The processor/drive circuitry 23 also illustratively includes a micro step-up transformer 25 that may be used in certain embodiments to increase the drive voltage for the finger sensor 30, as explained in greater detail below.

The finger sensor 30 may be of the slide type where the user's finger 26 slides over the sensing area to generate a sequence of finger images. Alternatively, the finger sensor 30 could be of the static placement type, where the user simply places his finger 26 onto the sensing surface to generate a finger image. Of course, the finger sensor 30 may also include circuitry embedded therein and/or in cooperation with the processor/drive circuit 23 to provide menu navigation and selection functions as will be appreciated by those skilled in the art.

Figure 2:
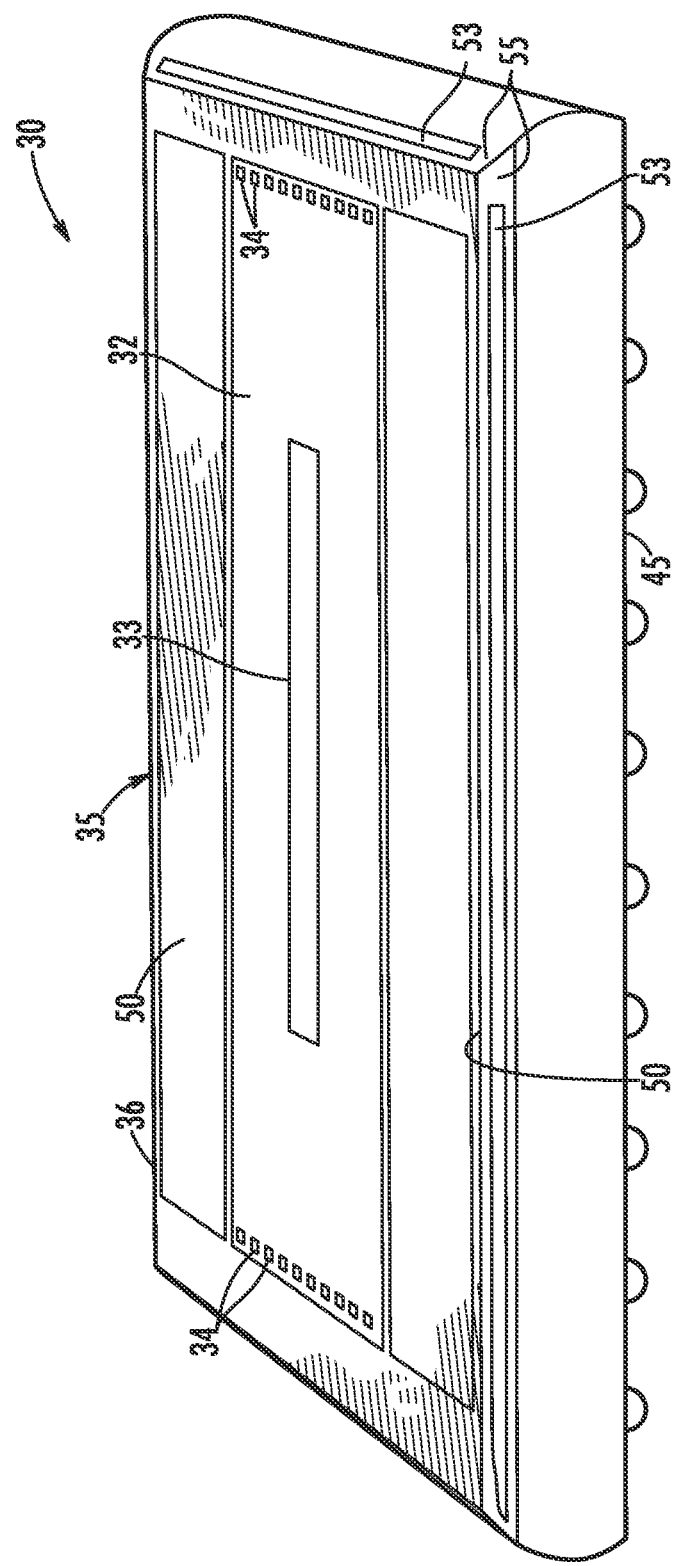
FIG. 2 is an enlarged perspective view of a portion of the finger sensor shown in FIG. 1.
Figure 3:
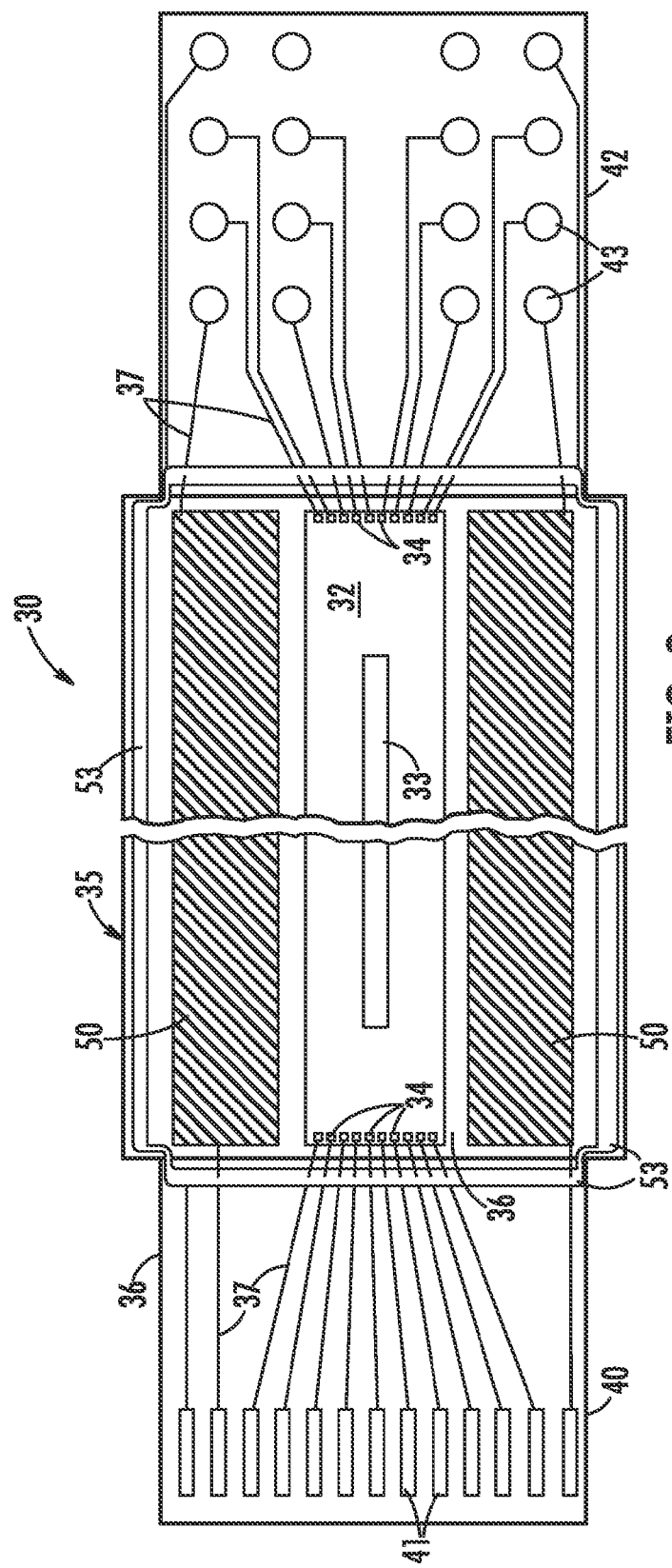
FIG. 3 is a plan view of a portion of the finger sensor as shown in FIG. 1 with alternative embodiments of connector portions being illustrated.

As shown perhaps best in FIGS. 2 and 3, the finger sensor 30 illustratively comprises a finger sensing integrated circuit (IC) 32 including a finger sensing area 33 and a plurality of bond pads 34 adjacent thereto. In particular, the finger sensing IC 32 may comprise a semiconductor substrate having an upper surface, and the finger sensing area 33 may comprise an array of sensing electrodes carried by the upper surface of the semiconductor substrate, such as for electric field finger sensing, for example. Capacitive and/or thermal sensing pixels may also be used, for example.

The finger sensor 30 also includes a flexible circuit 35 coupled to the IC finger sensor. More particularly, the flexible circuit 35 includes a flexible layer 36 covering both the finger sensing area 33 and the bond pads 34 of the IC finger sensor 32. The flexible circuit 32 also includes conductive traces 37 carried by the flexible layer 36 and coupled to the bond pads 34. Of course, the flexible layer 36 preferably comprises a material or combination of materials to permit finger sensing therethrough. Kapton is one such suitable material, although those of skill in the art will readily recognize other suitable materials. Kapton is also hydrophobic, providing an advantage that it may permit reading of partially wet or sweating fingers more readily, as any moisture may tend to resist smearing across the image as will be appreciated by those skilled in the art.

As shown perhaps best in FIG. 3, the flexible circuit may comprise one or more connector portions extending beyond the finger sensing area 33 and the bond pads 34. As shown, for example, in the left hand portion of FIG. 3, the connector portion may comprise a tab connector portion 40 wherein the conductive traces 37 terminate at enlarged width portions or tabs 41. With reference to the right hand side of FIG. 3, an alternative or additional connector portion may comprise the illustrated ball grid array connector portion 42, wherein the conductive traces 37 are terminated at bumps or balls 43 as will be appreciated by those of skill in the art.

Figure 4:
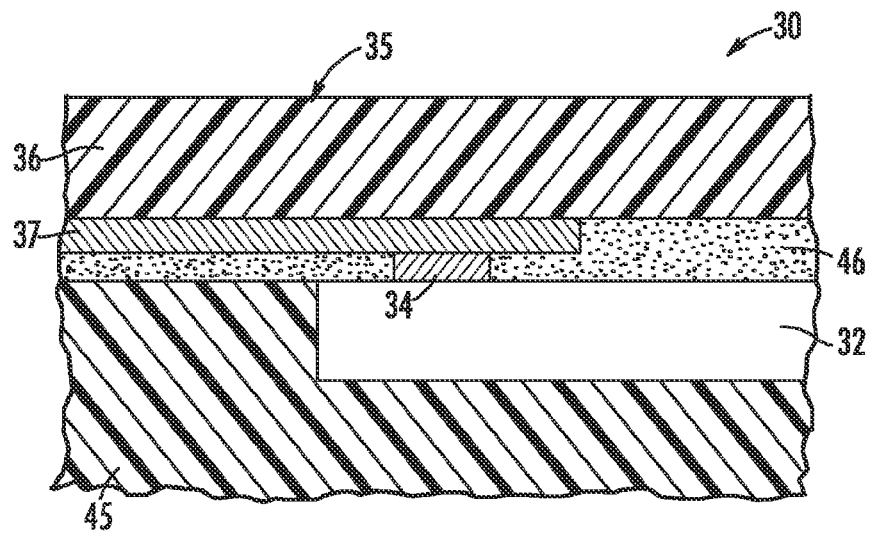
FIG. 4 is an enlarged schematic cross-sectional view through a portion of the finger sensor as shown in FIG. 1.

In the illustrated embodiment, the finger sensor 30 further includes an IC carrier 45 having a cavity receiving the finger sensing IC 32 therein (FIG. 4). The term IC carrier is meant to include any type of substrate or backing material on which or in which the finger sensing IC 32 is mounted. A fill material 46, such as an epoxy, is also illustratively provided between the IC finger sensor 32 and the flexible circuit 35. Accordingly, the IC finger sensor 32 may be readily coupled to external circuitry, and may also enjoy enhanced robustness to potential mechanical damage by finger or other object contact to the sensing area of the IC finger sensor.

The sensor 30 also includes a pair of drive electrodes 50 carried on an outer and/or inner surface of the flexible layer 36 as seen perhaps best in FIGS. 2 and 3. The drive electrodes 50 may be formed of the same conductive material as the conductive traces 37 used for the connector portions 40 or 42 as will also be appreciated by those skilled in the art. In other embodiments, only a single drive electrode 50 or more than two drive electrodes may be used. Even if the drive electrodes 50 are positioned on the inner surface of the flexible layer 36, they can still be driven with a sufficient signal strength to operate. The voltage-boosting micro transformer 25 as shown in FIG. 1, may be used, for example, to achieve the desired drive voltage on the drive electrodes 50, which may be up to about twenty volts for some embodiments.

The finger sensor 30 also includes one or more electrostatic discharge (ESD) electrodes 53 illustratively carried on the outer surface of the flexible layer 36 of the flexible circuit 35. Again the ESD electrodes 53 may be formed of a conductive material applied or deposited onto the flexible layer 36 similar to the conductive traces 37 as will be appreciated by those skilled in the art. The ESD electrodes 53 may be connected to a device ground, not shown, via one or more of the conductive traces 37.

As shown in the illustrated embodiment, the IC carrier 45 has a generally rectangular shape with four beveled upper edges 55 as perhaps best shown in FIG. 2. The beveled edges 55 are underlying or adjacent the ESD electrode 53. Of course, in other embodiments, a different number or only a single beveled edge 55 and adjacent ESD electrode 53 may be used.

Figure 5:
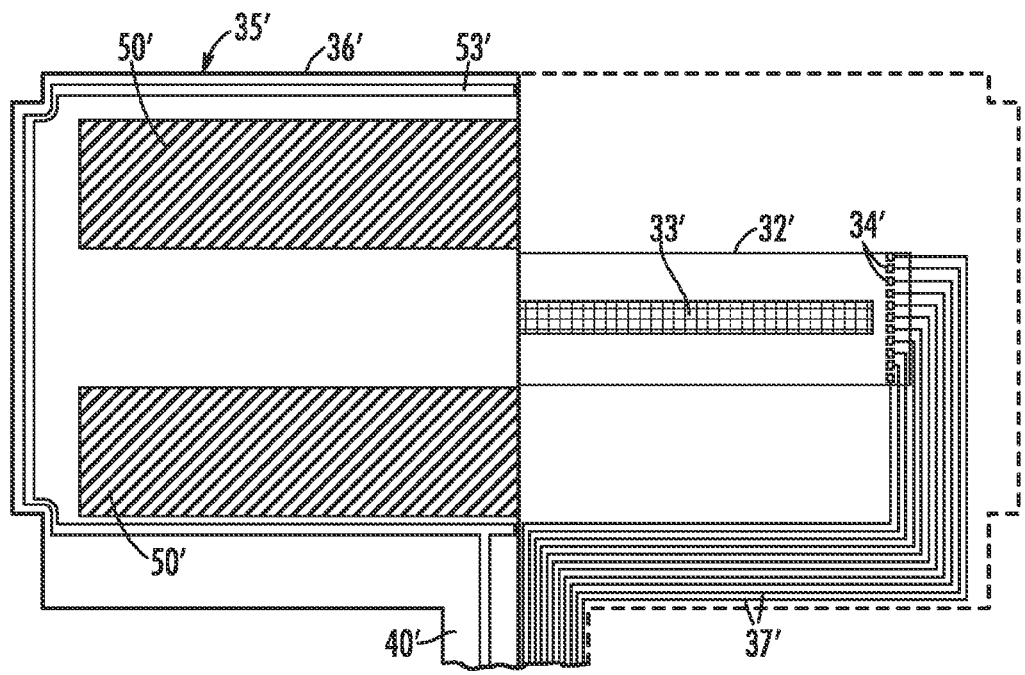
FIG. 5 is a plan view of a portion of a finger sensor in accordance with the invention, similar to FIG. 3, but showing a different embodiment of a connector portion.

Referring now briefly to FIG. 5, another embodiment of flexible circuit 35' suitable for the finger sensor 30 is described. In this embodiment, the tab connector portion 40' extends from the side of the flexible layer 36' rather than an end as shown in FIG. 3. For clarity of illustration, the right hand portion of the flexible layer 36 is not shown. Those other elements of FIG. 5 not specifically mentioned are similar to those corresponding elements described above with reference to FIG. 3 and need no further discussion herein.

Referring now additionally to FIG. 6 mounting of the finger sensor 30 is now described. In the illustrated embodiment, portions of the housing define an integral frame 21 surrounding the upper perimeter of the flexible circuit 35 that, in turn, is carried by the IC carrier 45. This positions the ESD electrodes 53 on the beveled edges of the IC carrier 45. Moreover, the integral frame 21 has inclined surfaces corresponding to the beveled edges of the IC carrier 45. This defines ESD passages 63 to the ESD electrodes 53 as will be appreciated by those skilled in the art. In other words, this packaging configuration will effectively drain off ESD through a small gap 63 between the frame and the flexible layer 36 and without having the ESD electrodes 53 directly exposed on the upper surface of the sensor 30.

The finger sensor 30 may further include at least one electronic component 64 carried by the flexible layer as also explained with reference to FIG. 6. For example, the at least one electronic component 64 may comprise at least one of a discrete component, a light source, a light detector, and another IC. If a light source or light detector is used, it will more likely be positioned so as to be on the upper surface of the sensor. U.S. Published Application No. 2005/0069180, assigned to the assignee of the present invention and the entire contents of which are incorporated herein by reference, discloses various infrared and optical sensors and sources that may be used in combination with the packaging features disclosed herein. Similarly, if another IC comprises another finger sensing IC, for example, it would also be positioned adjacent the IC 32 on the upper surface of the IC carrier 45 as will be appreciated by those skilled in the art. For example, two or more such ICs could be positioned so that their sensing areas were able to capture images end-to-end, even if the chips themselves were staggered. Processing circuitry would stitch the images together widthwise in this example.

The mounting arrangement of FIG. 6 also illustrates another packaging aspect wherein a biasing member in the form of a body of resilient material 62, such as foam, is positioned between the illustrated device circuit board 60 and the IC carrier 45. The resilient body of material 62 permits the finger sensor 30 to be displaced downwardly or into the device to absorb shocks or blows, and causes the sensor to be resiliently pushed back into the desired alignment. The inclined surfaces of the integral frame and beveled edges 55 of the IC carrier 45 also direct the proper alignment of the sensor 30 as it is restored to its upper position as will be appreciated by those skilled in the art.

A slightly different mounting arrangement for the finger sensor 30' is explained with additional reference to FIG. 7, wherein a separate frame 21' is provided that abuts adjacent housing portions 29'. The illustrated frame 21' also sets the finger sensing IC 32' below the level of the adjacent housing portions 29' for additional protection. Also, the biasing member is illustratively in the form of a backing plate 62' that is not attached on all sides and is, therefore, free to give and provide a returning spring force as will be appreciated by those skilled in the art. The backing plate may carry circuit traces to thereby serve as a circuit board as will be appreciated by those skilled in the art. Those other elements of FIG. 7 are similar to those indicated and described with reference to FIG. 6 and require no further discussion herein.

Yet another embodiment of a finger sensor 30" is now described with reference to FIG. 8. In this embodiment, adjacent housing portions define a frame 21", along one or more sides of the IC carrier 45". The frame 21" includes an upper portion 69" and a downwardly extending guide portion 66" offset from the upper portion that defines an interior step or shoulder 67". This step or shoulder 67", in turn, cooperates with the IC carrier lateral projection or tab 68" to define an upward stop arrangement. This tab 68" may be integrally formed with the IC carrier 45" or comprise a separate piece connected to the main portion of the carrier as will be appreciated by those skilled in the art. Accordingly, the IC carrier 45" may be deflected downwardly, and will be biased back upwardly into its desired operating position along the guide portion 66".

Figure 8:
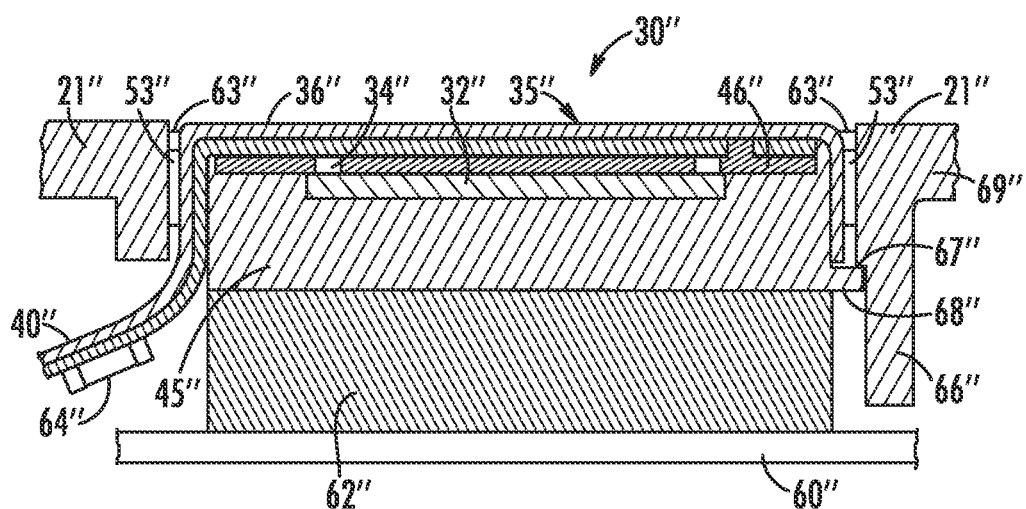
FIG. 8 is a schematic cross-sectional view of yet another embodiment of a mounted finger sensor in accordance with the invention.

The left hand portion of FIG. 8 shows an embodiment wherein the upward stop arrangement is not provided along one side to thereby readily accommodate passage of the connector portion 40". In yet other embodiments, slots could be provided in the flexible circuit 35" to accommodate tabs 68" to project therethrough and provide the upward stop arrangement as well. Those of skill in the art will appreciate other configurations of stop arrangements and mounting.

Figure 9:
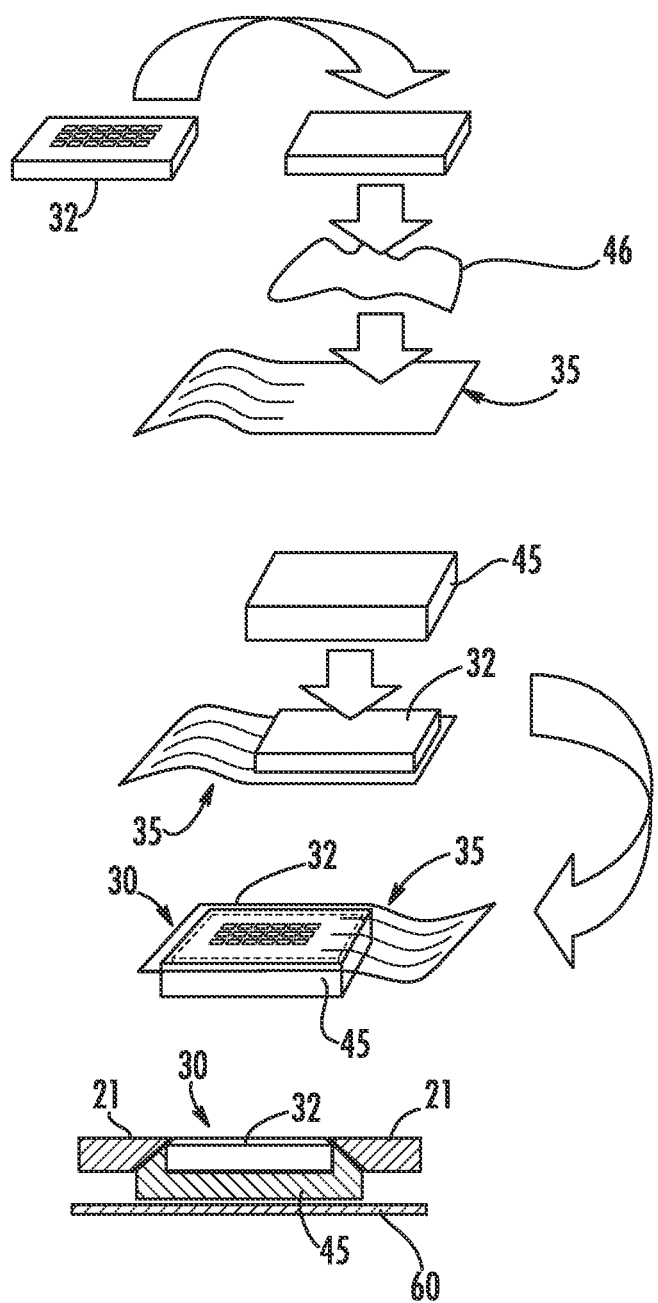
FIG. 9 is a schematic diagram illustrating some of the manufacturing steps for a finger sensor as shown in accordance with the invention.

Referring now additionally to FIG. 9, a method sequence for making the finger sensor 30 is now described. Beginning at the top of the figure, the finger sensing IC 32 is flipped over and coupled to the flexible circuit 35, such as using an epoxy or other suitable fill material 46. Thereafter, as shown in the middle of the figure, the IC carrier 45 is added to the assembly which is then illustratively rotated in the upward facing position. Lastly, as shown in the lowermost portion of FIG. 9, the finger sensor 30 is mounted between the frame 21 and the underlying circuit board 60. If the ball grid array connector portion 42 (FIG. 3) is used, this portion can be wrapped and secured underneath the IC carrier 45 as will be readily appreciated by those skilled in the art. This is but one possible assembly sequence, and those of skill in the art will appreciate other similar assembly sequences as well.

The epoxy or glue 46 may be Z-axis conductive glue, and/or it may incorporate resilient energy absorbing properties. The use of an anisotropic conductive material may physically extend the pixel's effective electrical interface away from the die. The conductive material may contact the finger interface itself or it may terminate on the underside of a top protective layer of material over the sensing array. The same anisotropic conductive material may be used to electrically bond the chip's external interface bond pads 34 to conductive traces 37 on the flexible layer 36.

The IC carrier 45 may be a plastic molding or other protective material, that may have resilient energy absorbing properties. It may incorporate multiple layers of different materials, or graded materials having a gradient in one or more physical properties such as stiffness. A stiff (non-stretching) but flexible material layer 36 (like Kapton) over a softer resilient material 46, all on top of the chip's surface 32, spreads the energy of a point impact across a larger area of the chip surface. The resilient material to connect the chip to the circuit board allows the chip—when under force—to move slightly with respect to the circuit board, reducing the stress on the chip. The beveled mechanical interface between the IC carrier 45 and the frame 21 allows movement in both the normal and shear directions with respect to relieve stress. The flexible circuit 35 may also include conductive patterns or traces, not shown, in the area over the sensing array to enhance the RF imaging capability.

The epoxy or glue 46 is a soft resilient layer between the stiffer flexible layer 36 and the very stiff silicon chip surface. This allows the flexible layer 36 to bend inward to reduce scratching from sharp points, and also reduce the transfer of sharp point forces to the silicon.

The IC carrier 45 and any biasing member 62 provide mechanical support to the silicon chip to prevent it from cracking when under stress, and may seal the finger sensing IC 32 and its edges from the environment. The biasing member 62 between the IC carrier 45 and the circuit board 60 can absorb shock energy in both the vertical and shear directions.

The top surface of a semiconductor chip is typically made of multiple layers of brittle silicon oxides and soft aluminum. This type of structure may be easily scratched, cracked, and otherwise damaged when force is applied to a small point on that surface. Damage typically occurs when the pressure applied to the insulating surface oxide propagates through to the aluminum interconnect material directly beneath it. The aluminum deforms removing support from under the oxide, which then bends and cracks. If sufficient force is applied, this process may continue through several alternating layers of silicon oxide and aluminum, short-circuiting the aluminum interconnects and degrading the chip's functionality.

In the package embodiments described herein, a sharp object approaching the sensor first contacts the substrate layer (typically Kapton tape). The substrate material deforms and presses into the resilient glue material, spreading the force over a larger area and reducing the maximum force per area transmitted. The spread and diluted force transmitted through the resilient glue now causes the chip to move downward away from the impacting object and into the resilient backing material. Some of the impact energy is converted into motion of the chip and ultimately into compression of the resilient backing material. Finally, when the chip is forced downward into the resilient backing, the chip will often tilt, encouraging the sharp object to deflect off the sensor. The stiffness of the various layers of resilient material are selected to protect the aluminum interconnects in the silicon chip against the most force possible.

The packaging concepts discussed above make a package that is: durable enough for use on the external surfaces of portable electronic equipment; and maintains good sensing signal propagation, resulting in good quality sensor data. The embodiments are relatively inexpensive and straightforward to manufacture in high volume.

Now reviewing a number of the possible advantages and features of the finger sensors disclosed herein, significant improvements in scratch resistance can be achieved by combining a surface material, like Kapton, that is relatively stiff and difficult to tear, with a softer glue material underneath. With this structure, when a sharply pointed object comes into contact, the surface material can indent, reducing the initial impact, spreading the force across a larger area, and preventing the point from penetrating the surface. When the object is removed, the resilient materials return to their original shapes.

A flexible substrate with a smooth surface and a low coefficient of friction (such as a Kapton tape) will help resist abrasion. The resilient structure described above can also improve abrasion resistance by preventing the abrasive particles from cutting into the surface. The resilient structure described above also provides several levels of protection against impacts of various intensities.

When a portable device like a cellphone is dropped, a shearing force is applied to any structure that interconnects the case with the internal circuit boards. In a sensor that is soldered to the internal circuit board and projects through a hole in the case, the full shearing force is applied to the sensor and its circuit board interconnects. In the package described above, the shear force is absorbed by the resilient material that may mechanically connect the sensor to the circuit board. If the shear force is extreme, the beveled sensor will slip under the case, converting the shear force into normal compression of the resilient backing material. When the impact event is over, the sensor will return to its normal position.

The package described can also provide protection against continuous pressure. When pressure is applied, the resilient backing compresses, allowing the sensor to retract from the surface a small distance. In many situations this will allow the case to carry more of the force, reducing the force on the sensor.

In the packaging described herein, the flexible substrate material also acts as an ESD (electrostatic discharge) barrier between the chip and its environment, preventing ESD from reaching the sensitive electronic devices on the chip. Accordingly, leakage current tingle may be significantly reduced or eliminated. A 1 mil Kapton layer provides an 8.6 Kv withstand capability. The ESD electrodes can capture discharges at higher voltages. The maximum voltage over the drive electrodes prior to air breakdown to the ESD electrode is 7.5 Kv. The distance from the farthest point of the drive electrode to the ESD capture electrodes is 2.5 mm, and the dry air dielectric breakdown is 3 Kv/mm. Accordingly, even with a clean surface (worst case) the ESD would discharge to the ESD capture electrode before penetrating the Kapton dielectric layer. In addition, over the array is provided 1 mil of Kaptom, plus 1 mil of epoxy, plus 2.5 microns of SiN. This may provide about 14.1 Kv dielectric withstand over the pixel array. This may eliminate a requirement for outboard ESD suppressors and associated circuitry.

Some mechanical durability data is provided below in TABLE 1. In particular, three devices are compared: a model 1510 small slide IC with a nitride coating and no adhesive, a 1510° C. with a polyimide coating and no adhesive, and a model 2501 large slide IC with a Kapton layer and acrylic adhesive/filler. The drill rod scratch and pencil scratch tests are ANSI tests. The other three tests are self-explanatory, and it can be seen that the Kapton/filler device enjoys a considerable advantage in terms of mechanical robustness.

TABLE 1

| Substrate | Bare Nitride | 7 μm Polyimide | 25 μm Kapton |
| --- | --- | --- | --- |
| Adhesive | N/A | N/A | Acrylic |
| Test Die | 1510 | 1510 | 2501 Ni |
| Drill Rod Scratch (grams) | <50 | 225 | 350 |
| Pencil Scratch (hardness) (5) | N/A | HB | 6H |
| 6.5 mm Ball Impact (gr cm) | 234 | 234 | 488 |
| 1.0 mm Ball Impact (gr cm) | <75 | <13 | 195 |
| Rock Tumbler (hrs) | N/A | <8 | 67 |

All or part of the desired circuitry may be included and mounted on the flexible circuit. The customer interface could then be a simple standard interface, such as a USE connector interface. LEDs can be included on the flexible circuit, or electroluminescent sources can be added as printed films. Organic LEDs can be printed as films on the underside of the flexible circuit.

Figure 10:
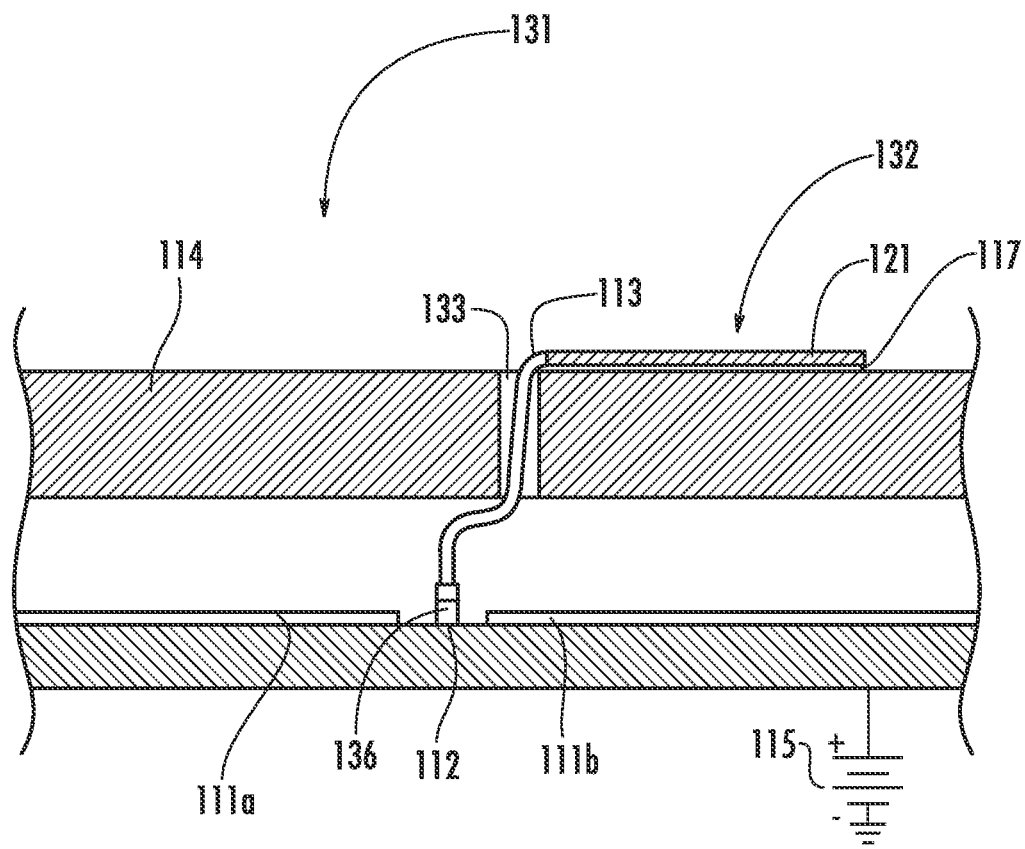
FIG. 10 is cross-sectional view of a portion of an electronic device including another embodiment of a finger sensor coupled thereto in accordance with the invention.
Figure 11:
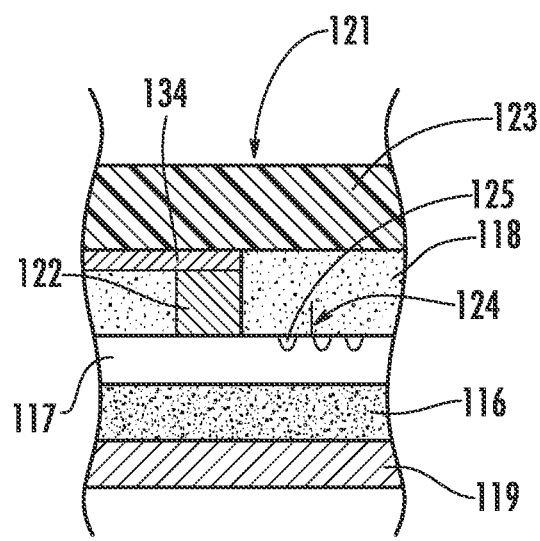
FIG. 11 is an enlarged cross-sectional view of a portion of the finger sensor of FIG. 10.

Referring now additionally to FIGS. 10-11, another embodiment of a finger sensor assembly 132 mounted on an electronic device 131 is now described. The electronic device 131 illustratively includes a housing 114 having a connector member opening 133 therein. The electronic device 131 also includes electronic circuitry 111a-b, such as other IC's, mounted on a printed circuit board 112 within the housing 114.

The finger sensor assembly 132 includes a thinned finger sensing integrated circuit (IC) 117 secured to the housing 114. Moreover, as will be appreciated by those skilled in the art, the thinned finger sensing IC 117 may have a thickness less than 200 microns, and more preferably, less than 50 microns in some embodiments. The connector member 113 illustratively extends through the connector member opening 133 in the housing 114 and couples the thinned finger sensing IC 117 and the electronic circuitry 111a-b of the electronic device 131.

An environmental sealant, not shown, may be used to seal the connector member opening 133 as will be appreciated by those skilled in the art. Advantageously, the finger sensor assembly 132 may be readily installed onto the housing 114 and coupled to the electronic circuitry 111a-b of the electronic device 131 without using unnecessary or otherwise valuable area on the PCB 112. In other words, the thinned finger sensing IC 117 is secured to the housing 114 opposite the electronic circuitry 111a-b on the PCB 112. The finger sensor assembly 132 may also be incorporated into other forms or devices, for example, as part of a formed or curved surface, a button, or a flexible card, as will be appreciated by those skilled in the art.

The finger sensor assembly 132 further comprises an adhesive layer 116 adhesively securing the thinned finger sensing IC 117 to the housing 114. As will be appreciated by those skilled in the art, other methods for securing the thinned finger sensing IC 117 to the housing 114 may be used. The adhesive layer 116 may comprise a pressure sensitive adhesive, for example. As will be appreciated by those skilled in the art, the finger sensor assembly 132 may be dispensed from a tape roll including a silicone paper release layer 119 (FIG. 11) carrying a plurality of sensor assemblies. Advantageously, the finger sensor assembly 132 may be easily secured onto the housing 114 of the electronic device 131 using conventional assembly techniques.

As noted above, the connector member 113 comprises a flexible circuit 121 including a flexible layer 123. The connector member 113 also includes conductive traces 134 carried by the flexible layer 123 and coupled to respective bond pads 122. The flexible layer 123 covers both the finger sensing area 124 and the plurality of bond pads 122. In other embodiments, the flexible layer 123 need not cover the sensing area. Indeed, in other embodiments, a connector member different than the flexible circuit 121 may be used as will be appreciated by those skilled in the art. The flexible circuit 121 illustratively includes a connector portion extending outwardly beyond the finger sensing area 124 and bond pads 122.

The electronic circuitry 111a-b also comprises the printed circuit board 112 and the finger sensor connector 136 carried thereby, with the finger sensor connector receiving the connector portion of the flexible circuit 121. The finger sensor assembly 132 further comprises a fill material 118 between the finger sensing IC 117 and the flexible circuit 121. As will be appreciated by those skilled in the art, the fill material may comprise epoxy or any other suitable material. The finger sensor assembly 132 may also include a drive electrode and an electrostatic discharge (ESD) electrode carried by the flexible layer 123, and an electronic component carried by the flexible layer 123 as discussed extensively in the earlier embodiments.

The thinned finger sensing IC 117 comprises a thinned semiconductor substrate having an upper surface and having an array of sensing electrodes 125 carried by the upper surface of the thinned semiconductor substrate. The electronic device 131 may further comprise a rechargeable battery 115 carried by the housing 114 and coupled to the electronic circuitry 111a-b.

A method aspect is for making the electronic device 131. The method may comprise providing a housing 114 having the connector member 133 opening therein and electronic circuitry 111a-b contained therein, and securing the finger sensor assembly 132 onto the housing. As will be appreciated by those skilled in the art, the finger sensor assembly 132 may comprise the thinned finger sensing IC 117, such as having a thickness less than 200 microns. The connector member 113 may extend through the connector member opening 133 in the housing 114 and couple the thinned finger sensing IC 117 and the electronic circuitry 111a-b.

Other features and advantages in accordance with the invention may be understood with reference to copending applications entitled: FINGER SENSOR INCLUDING ENHANCED ESD PROTECTION AND ASSOCIATED METHODS, U.S. patent application Ser. No. 11/550,690, and FINGER SENSING WITH ENHANCED MOUNTING AND ASSOCIATED METHODS, U.S. patent application Ser. No. 11/550,693, the entire disclosures of which are incorporated herein by reference. Accordingly, many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that other modifications and embodiments are intended to be included within the scope of the appended claims.

That which is claimed is:

1. An electronic device comprising:
a housing having at least one connector member opening therein;
a printed circuit board (PCB) carried within said housing;
a thinned finger sensing integrated circuit (IC) carried by said housing in spaced relation from said PCB, and having a thickness less than 200 microns; and
at least one connector member coupled to said thinned finger sensing IC and extending through the at least one connector member opening in said housing.

2. The electronic device according to claim 1 wherein said thinned finger sensing IC comprises a monocrystalline substrate.

3. The electronic device according to claim 1 wherein said housing has a non-planar surface; and wherein said thinned finger sensing IC is secured to the non-planar surface and conforms in shape thereto.

4. The electronic device according to claim 1 further comprising an adhesive layer adhesively securing said thinned finger sensing IC to said housing.

5. The electronic device according to claim 4 wherein said adhesive layer comprises a pressure sensitive adhesive.

6. The electronic device according to claim 1 wherein said thinned finger sensing IC has a thickness less than 50 microns.

7. The electronic device according to claim 1 wherein said thinned finger sensing IC comprises a finger sensing area and a plurality of bond pads adjacent thereto; and wherein said at least one connector member comprises a flexible circuit including a flexible layer, and a plurality of conductive traces carried by said flexible layer and coupled to respective ones of said plurality of bond pads.

8. The electronic device according to claim 7 wherein said flexible layer covers both said finger sensing area and said plurality of bond pads.

9. The electronic device according to claim 7 wherein said flexible circuit comprises a connector portion extending outwardly beyond said finger sensing area and said plurality of bond pads.

10. The electronic device according to claim 7 further comprising at least one of a drive electrode and an electrostatic discharge (ESD) electrode carried by said flexible layer.

11. An electronic device comprising:
a housing;
a printed circuit board (PCB) carried within said housing;
a thinned finger sensing integrated circuit (IC) comprising a monocrystalline substrate; and
a pressure sensitive adhesive layer adhesively securing said thinned finger sensing IC to said housing in spaced relation from said PCB.

12. The electronic device according to claim 11 wherein said housing has a non-planar surface; and wherein thinned finger sensing IC is secured to the non-planar surface and conforms in shape thereto.

13. The electronic device according to claim 11 wherein said thinned finger sensing IC has a thickness less than 50 microns.

14. The electronic device according to claim 11 wherein said thinned finger sensing IC comprises a finger sensing area and a plurality of bond pads adjacent thereto; and further comprising at least one connector member comprising a flexible circuit including a flexible layer, and a plurality of conductive traces carried by said flexible layer and coupled to respective ones of said plurality of bond pads.

15. The electronic device according to claim 14 wherein said flexible layer covers both said finger sensing area and said plurality of bond pads.

16. A finger sensor assembly comprising:
a thinned finger sensing integrated circuit (IC) having a thickness less than 200 microns;
a pressure sensitive adhesive layer on said thinned finger sensing IC;
a release layer temporarily covering said pressure sensitive adhesive layer; and
at least one connector member coupled to said thinned finger sensing IC.

17. The finger sensor assembly according to claim 16 wherein said thinned finger sensing IC comprises a monocrystalline substrate.

18. The finger sensor assembly according to claim 16 wherein said thinned finger sensing IC has a thickness less than 50 microns.

19. The finger sensor assembly according to claim 16 wherein said thinned finger sensing IC comprises a finger sensing area and a plurality of bond pads adjacent thereto; and wherein said at least one connector member comprises a flexible circuit including a flexible layer, and a plurality of conductive traces carried by said flexible layer and coupled to respective ones of said plurality of bond pads.

20. The finger sensor assembly according to claim 19 wherein said flexible layer covers both said finger sensing area and said plurality of bond pads.

21. The finger sensor assembly according to claim 19 wherein said flexible circuit comprises a connector portion extending outwardly beyond said finger sensing area and said plurality of bond pads.

22. A method for making an electronic device comprising:
securing onto a housing having a printed circuit board (PCB) carried therein, a thinned finger sensing integrated circuit (IC) having a thickness less than 200 microns; and extending at least one connector member, coupled to the thinned finger sensing IC, through at least one connector member opening in the housing.

23. The method according to claim 22 wherein the thinned finger sensing IC comprises a monocrystalline substrate.

24. The method according to claim 22 wherein securing the finger sensor assembly further comprises adhesively securing the thinned finger sensing IC to the housing with an adhesive layer.

25. The method according to claim 24 wherein the adhesive layer comprises a pressure sensitive adhesive.

26. The method according to claim 22 wherein the thinned finger sensing IC has a thickness less than 50 microns.

27. The method according to claim 22 wherein the thinned finger sensing IC comprises a finger sensing area and a plurality of bond pads adjacent thereto; and wherein the at least one connector member comprises a flexible circuit including a flexible layer, and a plurality of conductive traces carried by the flexible layer and coupled to respective ones of the plurality of bond pads.

28. The method according to claim 27 wherein the flexible layer covers both the finger sensing area and the plurality of bond pads.

29. The method according to claim 27 wherein the flexible circuit comprises a connector portion extending outwardly beyond the finger sensing area and the plurality of bond pads.

\* \* \* \* \*